United States Patent [19]

Chan

[11] 4,214,175
[45] Jul. 22, 1980

[54] HIGH-PERFORMANCE ADDRESS BUFFER FOR RANDOM-ACCESS MEMORY

[75] Inventor: John Y. Chan, Belmont, Calif.

[73] Assignee: Fairchild Camera and Instrument Corporation, Mountain View, Calif.

[21] Appl. No.: 944,687

[22] Filed: Sep. 22, 1978

[51] Int. Cl.² .................. H03K 5/02; H03K 3/353; G11C 7/06; G11C 8/00
[52] U.S. Cl. .................................. 307/264; 307/205; 307/279; 307/350; 307/DIG. 1; 365/230
[58] Field of Search ............ 307/205, 264, 270, 279, 307/289, 291, 350, DIG. 1, DIG. 5; 365/230, 195, 196, 231

[56] References Cited

U.S. PATENT DOCUMENTS

| | | | |
|---|---|---|---|
| 3,795,898 | 3/1974 | Mehta et al. | 307/DIG. 5 X |
| 3,848,237 | 11/1974 | Geilhufe et al. | 307/DIG. 1 X |
| 3,938,109 | 2/1976 | Gionis et al. | 365/230 X |
| 3,940,747 | 2/1976 | Kuo et al. | 307/DIG. 1 X |
| 3,942,160 | 3/1976 | Yu | 365/230 X |
| 4,031,415 | 6/1977 | Redwine et al. | 307/DIG. 5 X |
| 4,074,148 | 2/1978 | Sato | 307/DIG. 1 X |
| 4,077,031 | 2/1978 | Kitigawa et al. | 307/DIG. 1 X |
| 4,087,704 | 5/1978 | Mehta et al. | 307/DIG. 1 X |
| 4,104,733 | 8/1978 | Satoh | 307/DIG. 5 X |
| 4,149,099 | 4/1979 | Nagami | 307/DIG. 1 X |

OTHER PUBLICATIONS

Foss et al, "should MOS-RAMs be TTL-Compatible," *Electronic Design* (pub.), 6/7/76, pp. 144-146.

*Primary Examiner*—Larry N. Anagnos
*Attorney, Agent, or Firm*—Alan H. MacPherson; Paul J. Winters; Robert C. Colwell

[57] ABSTRACT

A high-performance address buffer for use with a dynamic random-access memory is transistor-transistor logic-input compatible, utilizing a time constant on which activation of one output is dependent.

5 Claims, 4 Drawing Figures

HIGH-PERFORMANCE ADDRESS BUFFER FOR RANDOM-ACCESS MEMORY

BACKGROUND OF THE INVENTION

This invention relates to address input buffers for use with a random-access memory.

In a dynamic random-access memory, in the read or write mode thereof, the x and y addresses in the random-access memory are gained through decoders, in turn operatively connected with respective address buffers. In the general prior-art design, each buffer has a number of inputs connected therewith, each of which is in a high or low state, with each input controlling the state of a pair of outputs, in turn communicating with the respective decoder. As commonly used, a high input determines a high-low output pair, while a low input determines the reverse, or low-high output pair.

It will be understood that it is highly desirable that such a buffer be compatible with transistor-transistor-logic input, meanwhile being rapid and effective in operation even with a relatively large variation in power supply.

Various designs for use in such environment exhibited certain drawbacks. For example, in certain buffer designs, the buffer speed varies with input level. Also, the input level may affect loading. Additionally, a high peak current may be required for fast buffer output. It is also to be noted that some of these buffer circuits also exhibit sensitivity problems, and require complex clocking schemes.

One known design uses a constant supply voltage as a reference chosen as between the low and high voltage levels of the system. Such a system, while generally effective in performance, includes certain problems. For example, the maintenance of such reference voltage dissipates current which adds to the chip stand-by mode power dissipation. Additionally, the circuit scheme incorporating this system has been found to be relatively complicated, and it has also been found rather difficult to maintain such reference voltage at a substantially constant level.

SUMMARY OF THE INVENTION

It is accordingly an object of this invention to provide a high-performance address buffer for use with a dynamic random-access memory.

It is the further object of this invention to provide an address buffer which, while fulfilling the above object, is transistor-transistor-logic input compatible.

It is a still further object of this invention to provide apparatus which, while fulfilling the above objects, is extremely rapid and effective in operation, with the speed thereof not varying to any great extent with input level.

It is a still further object of this invention to provide apparatus which, while fulfilling the above objects, is simple in design and does not depend on the maintenance of a reference voltage for proper operation thereof.

It is still another object of this invention to provide apparatus which, while fulfilling the above objects, does not require complex clocking schemes and does not exhibit sensitivity problems.

Broadly stated, the invention comprises a buffer circuit apparatus having a high-low state input and a pair of high-low state outputs. The apparatus comprises means for initially providing that both outputs are in their low states, and means for sampling the input to determine the state of the input. First output determining means are included for providing that subsequent to the input being sampled as of one state, one of the outputs is driven to its high state after a certain period of time subsequent to the sampling, with the other output remaining in its low state. Second output determining means are included for providing that subsequent to the input being sampled as of the other state, the other output is driven to its high state in a period of time less than the certain period of time, with the one output being held in its low state upon the other output being driven into its high state.

BRIEF DESCRIPTION OF THE DRAWINGS

Other objects of the invention will become apparent from a study of the following specification and drawings, in which.

DESCRIPTION OF THE PREFERRED EMBODIMENT

Figure 1:
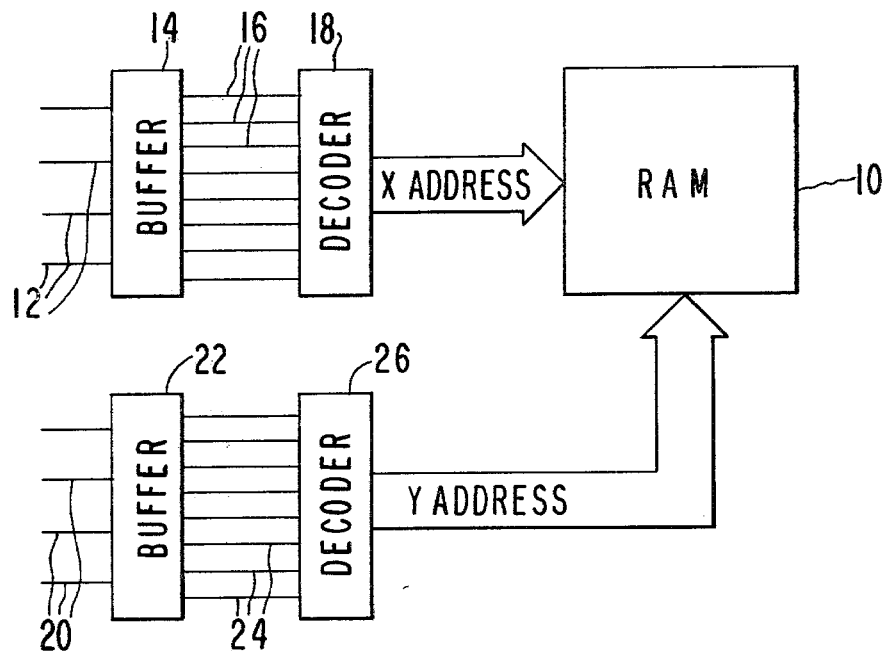
FIG. 1 is a block diagram showing the general system of the present invention.
Figure 2:
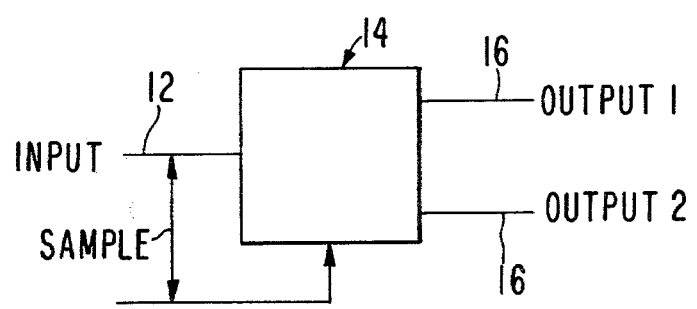
FIG. 2 is a block diagram of a portion of the apparatus of FIG. 1.

Schematically shown in FIG. 1 is a random-access memory 10 in combination with means for providing x addressing and y addressing thereof. As is well known, the means for providing x addressing thereof includes a number of inputs 12 communicating with a buffer 14 which is the subject of the present invention. Each input 12 is operatively connected with a pair of outputs 16 as will be further described, with the outputs 16 in turn connected to a decoder 18, which is in turn connected with the random-access memory 10. Similarly, in regard to the y addressing means, a number of inputs 20 communicate with another buffer 22 which embodies the present invention, each input 20 determining the state of a pair of outputs 24, with the outputs 24 in turn connected with a decoder 26, in turn communicating with the random-access memory 10. A simple general representation of the present apparatus is shown in FIG. 2, wherein a single buffer input 12, either in a high- or low-voltage state, is sampled to determine that state, and that information is used to determine the states of a pair of outputs 1 and 2 of the buffer 14. For example, it will be shown that if the input is sampled as low, this will provide that output 1 is low while output 2 is high. Conversely, if the input is sampled as high, this will provide that output 1 is high while output 2 is low.

Figure 3:
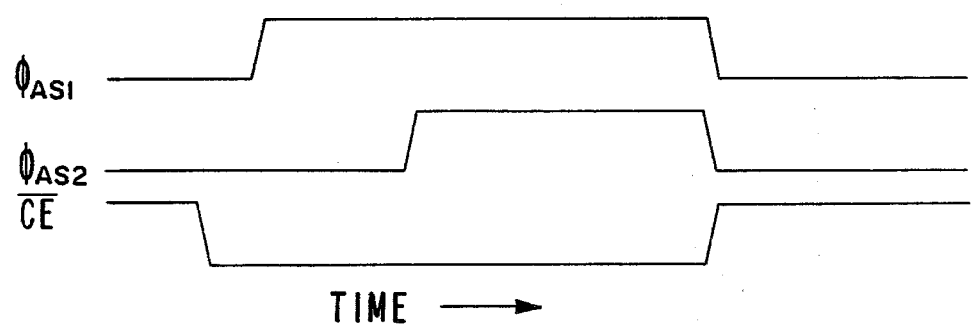
FIG. 3 is a timing diagram of various voltages in the system.
Figure 4:
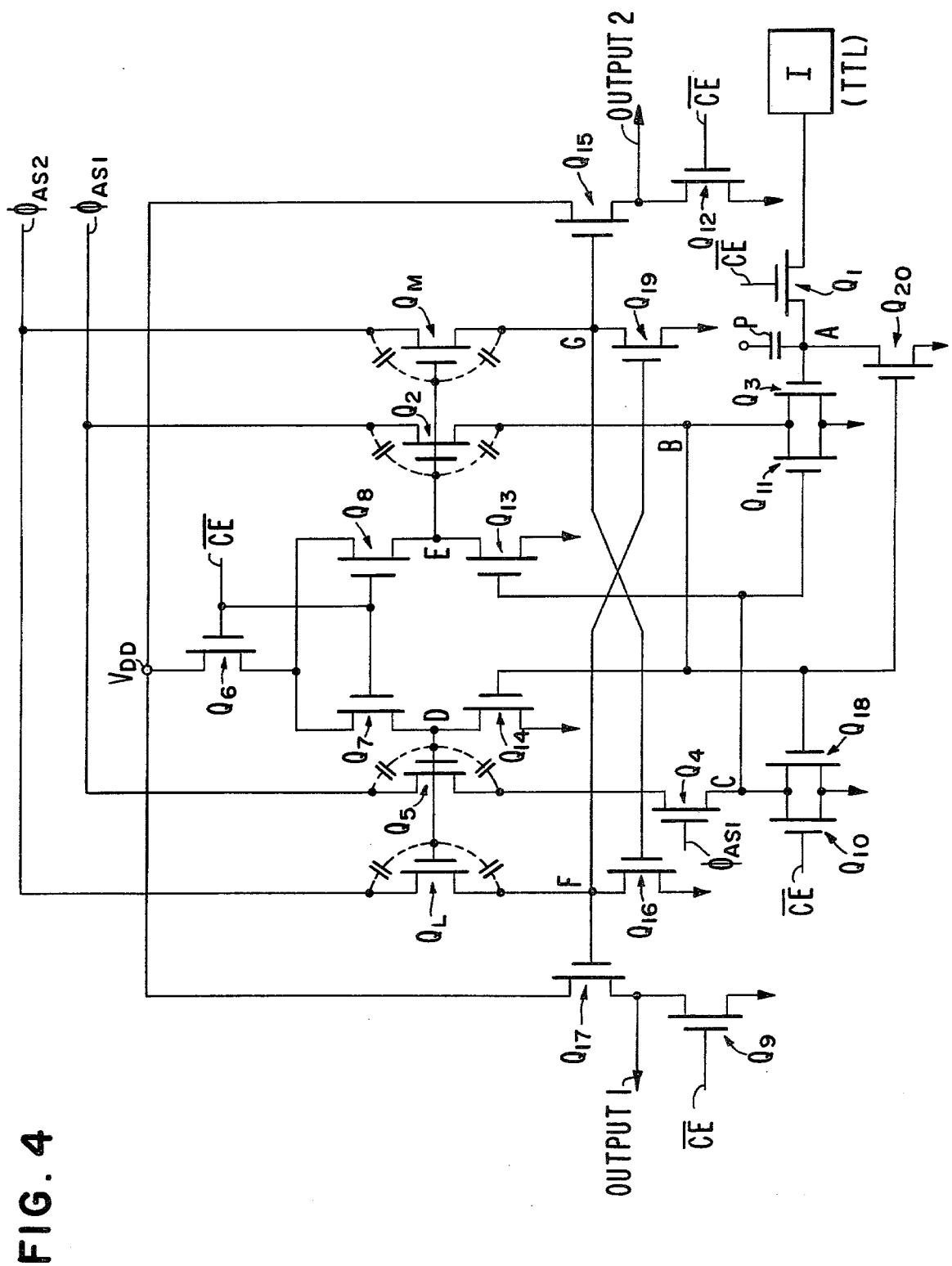
FIG. 4 is an electrical schematic of the buffer of the present invention.

Referring to FIG. 4, the schematic of the electrical circuit embodying the present invention is shown. A plurality of MOS transistors are utilized, and connected as shown therein. Assuming a state wherein Chip Enable ($\overline{CE}$) is high RESET, as will be further described, transistor Q6, connected with voltage source $V_{DD}$, is on, as are transistors Q7, Q8 and Q1. Transistors Q9 and Q12 are on, providing that both outputs are low, and transistor Q10 is on. Supply voltages $\phi_{AS1}$, $\phi_{AS2}$ at time t=0 are low (FIG. 3), so that transistor Q4 is off. Nodes B and C are low, since $\phi_{AS1}$ and $\phi_{AS2}$ are low at this time, so that transistors Q14 and Q13 are off. Nodes D and E are high, so that transistors QL, Q5, Q2 and QM are on, but node B remains low since $\phi_{AS1}$ is low. As $\phi_{AS2}$ is low, transistors Q15 and Q16 are off as are transistors Q17 and Q19.

It will be seen that as the system remains in this state for a period of time determined by the clocks, outputs 1 and 2 remain low.

The state of the input, i.e., either high or low, exists at block I, and such state is sampled as will now be described. After passage of time, $\overline{CE}$ goes low, turning transistors Q1, Q6, Q7, Q8, Q9, Q10 and Q12 off. Nodes D and E remain high due to the charge stored at the device capacitances of transistors QL, Q5, Q2, QM, shown in FIG. 4. However, when $\overline{CE}$ was high, the voltage of the input was stored in the capacitor P and remains there even after $\overline{CE}$ goes low. Thus, if the voltage of the input I is, for example, high, node A has become high, and such voltage is stored in capacitor P and transistor Q3 turns on. At the end of the sample voltage time, that is, at the end of the $\overline{CE}$ voltage transition to low, $\phi_{AS1}$ goes high (FIG. 3), turning on transistor Q4. With node B low, transistors Q14 and Q18 are off. With transistor Q4 on, node C goes high, with node B remaining low because transistor Q3 is on. With node C high, transistor Q13 is on, driving node E low, and shutting off transistors Q2 and QM. Upon node C being driven high, Q11 turns on, ensuring that node B remains low even if capacitor P discharges over a period of time.

Subsequent in time to this happening, $\phi_{AS2}$ goes high, driving node F high, turning transistor Q17 on, so that output 1 goes from low to high. It will be seen that output 2 remains low because transistor QM is off.

Upon a sufficient passage of time, Chip Enable $\overline{CE}$ again goes high, whereupon $\phi_{AS1}$ and $\phi_{AS2}$ return to their low states and the circuit condition is as initially described. Assuming that input is low rather than high, node A remains low no matter what the condition of $\overline{CE}$, so that transistor Q3 remains off. Upon $\phi_{AS1}$ going high, both node C as previously described and node B start to go high. However, node C is delayed due to the necessity of $\phi_{AS1}$ turning on transistor Q4. Thus, because of less resistance to $\phi_{AS1}$ through the path to node B, transistors Q14 and Q18 are enabled before transistor Q13. Once transistor Q18 is enabled, node C remains low with node B high. In such state, transistors Q5 and QL are disabled through enabling of transistor Q14. When $\phi_{AS2}$ subsequently goes high, node C goes high, turning on transistor Q15 so that output 2 goes high, with output 1 remaining low. Additionally upon node B going high, transistor Q20 is turned on, driving node A low in preparation for the next cycle.

Subsequently, the Chip Enable voltage increase brings the voltages $\phi_{AS1}$ and $\phi_{AS2}$ low.

It will be seen that with the system disclosed herein, with a high input being sampled, output 1 will go high after a substantially constant certain period of time, dependent upon the time necessary to bring node C high. In such case, output 2 will remain low. In the case where a low input is sampled, such that transistor Q3 is off, node C will still tend to go high, but node B will go high sooner than node C. In effect, a ratio stage exists in this circuit, for detecting the input level. In the past a ratio stage of this general type has not been desirable in dynamic random-access memory systems due to the inherent higher power dissipation. The present system avoids such problems due to the novel design set forth herein. The present circuitry can be readily fabricated with integrated circuit technology.

I claim:

1. A buffer circuit apparatus having a high-low state input and a pair of high-low state outputs, comprising:
   means for initially providing that both outputs are in their low states;
   means for sampling the input to determine the state of said input;
   first output determining means for providing that subsequent to said input being sampled as of one state, one of the outputs is driven to its high state after a substantially certain period of time subsequent to said sampling, with the other output remaining in its low state; and
   second output determining means for providing that subsequent to said input being sampled as of the other state, the other output is driving to its high state in a period of time less than said substantially certain period of time, with the one output being held in its low state upon the other output being driven to its high state.

2. The apparatus of claim 1 wherein the first and second output determining means comprise a first circuit portion operatively connected with a first transistor, and a second circuit portion operatively connected with a second transistor, and means for providing that, with said first transistor closed and said second transistor open, the second circuit portion is driven to a high state at a certain rate while the first circuit portion remains at a low state; and for providing that, with the first transistor open and the second transistor open, the first circuit portion is driven to a high state at a rate greater than the rate of the second circuit portion being driven to a high state.

3. The apparatus of claim 2, whereupon the first circuit portion being driven sufficiently high, the second transistor is closed, so that the second circuit portion is held low.

4. The apparatus of claim 3 and further comprising means for providing that the first circuit portions remains in its low state upon the second output reaching its high state.

5. The apparatus of claim 4 wherein the one state of the input is the high state thereof, while the other state of the input is the low state thereof.

* * * * *